United States Patent
Alina et al.

(10) Patent No.: US 6,366,472 B2
(45) Date of Patent: *Apr. 2, 2002

(54) APPARATUS AND METHOD FOR INHIBITING ELECTROMAGNETIC INTERFERENCE

(75) Inventors: Joseph S. Alina, Dupont; Nadir Sharaf; Ishfaqur Raza, both of Olympia, all of WA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/450,841

(22) Filed: Nov. 29, 1999

(51) Int. Cl.[7] .................................................. H05K 9/00
(52) U.S. Cl. ........................ 361/800; 361/816; 361/818; 174/35 R; 439/608
(58) Field of Search ................................ 361/752, 753, 361/80, 799, 816, 818; 174/35 R; 439/608–610; 381/355

(56) References Cited

U.S. PATENT DOCUMENTS

| | | | | |
|---|---|---|---|---|
| 4,384,165 A | * | 5/1983 | Loving, Jr. et al. | 174/35 R |
| 5,175,395 A | * | 12/1992 | Moore | 174/35 R |
| 5,354,951 A | * | 10/1994 | Lauge, Sr. et al. | 174/35 R |
| 5,365,410 A | * | 11/1994 | Lonka | 361/916 |
| 5,414,597 A | * | 5/1995 | Lindland et al. | 361/816 |
| 5,583,733 A | * | 12/1996 | Cronin | 361/111 |
| 5,895,884 A | * | 4/1999 | Davidson | 174/35 R |

* cited by examiner

Primary Examiner—Jayprakash N. Gandhi
Assistant Examiner—Tuan Dinh
(74) Attorney, Agent, or Firm—Blakely, Sokoloff, Taylor & Zafman LLP

(57) ABSTRACT

An apparatus and method for inhibiting EMI leakage is disclosed. In one embodiment of the present invention, an enclosure for surrounding an EMI producing device has protrusions extending from an edge of the enclosure. The protrusions are insertable into a printed circuit board to make contact with a grounding layer in the printed circuit board. In another embodiment, the enclosure is mateable with an EMI containment box, such as a Faraday cage, to fully enclose an EMI producing device.

12 Claims, 7 Drawing Sheets

APPARATUS AND METHOD FOR INHIBITING ELECTROMAGNETIC INTERFERENCE

BACKGROUND OF THE INVENTION

1. Field of the Invention

The present invention relates generally to electromagnetic interference (EMI) producing devices, and more specifically to EMI inhibiting shields.

2. Background Information

EMI is produced by numerous electronic devices and can affect systems and individual components. Specifically, a microprocessor can produce enough EMI to affect neighboring microprocessors and other circuitry. As the complexity and operating speed of microprocessors increase, the production of EMI increases and significantly impedes the efficient operation of neighboring circuitry. Furthermore, the socket in which a microprocessor is placed can also contribute to the production of EMI.

FIG. 1 shows an example of a prior art apparatus for inhibiting EMI. EMI producing device 10, such as a microprocessor, is disposed on a substrate 14, such as a printed circuit board. A cap 12 is placed over EMI producing device 10 to help contain the EMI emanating from device 10. However, cap 12 by itself does not provide complete containment of EMI. Leaking EMI 16 escapes through the gap between cap 12 and substrate 14. As device 10 continues to run, the amount of leaking EMI 16 will increase and interfere with neighboring devices and circuitry.

Thus, what is desired is an apparatus and method for providing more complete containment of EMI.

SUMMARY OF THE INVENTION

In one embodiment of the present invention, an enclosure for inhibiting electromagnetic interference (EMI) has protrusions extending from an edge of the enclosure.

Additional features and benefits of the present invention will become apparent from the detailed description, figures and claims set forth below.

BRIEF DESCRIPTION OF THE DRAWINGS

Various embodiments of the present invention will be described in detail with reference to the following drawings in which like reference numerals refer to like elements. The present invention is illustrated by way of example and not limitation in the accompanying figures.

DETAILED DESCRIPTION

The following description provides embodiments of the present invention. However, it will be appreciated that other embodiments of the present invention will become apparent to those of ordinary skill in the art upon examination of this description. Thus, the present description and accompanying drawings are for purposes of illustration and are not to be used to construe the invention in a restrictive manner.

Figure 1:
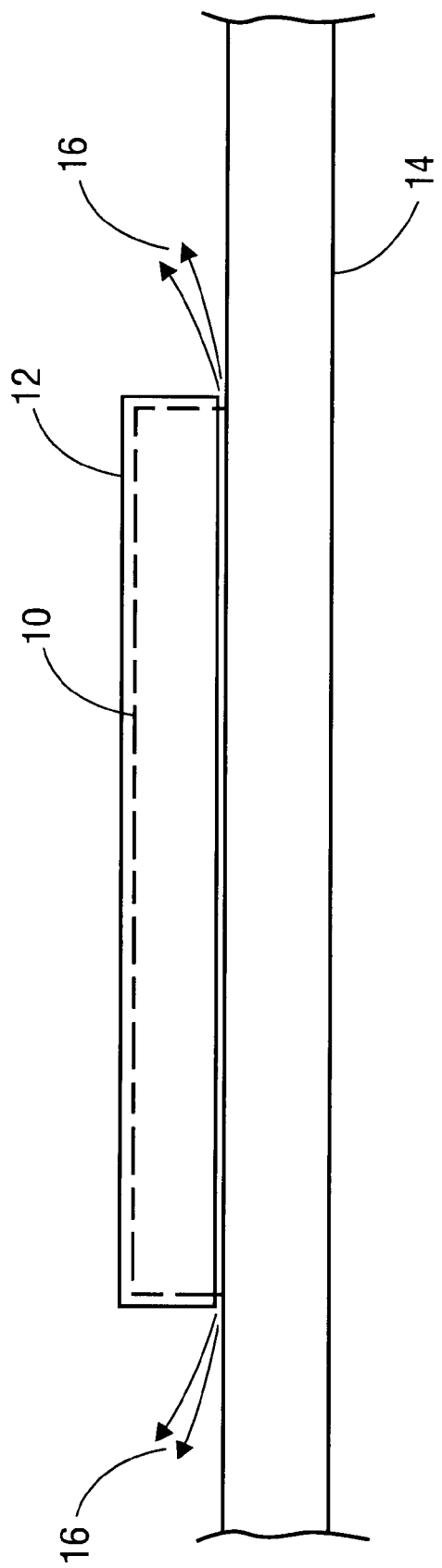
FIG. 1 shows a prior art apparatus for inhibiting EMI.
Figure 2:
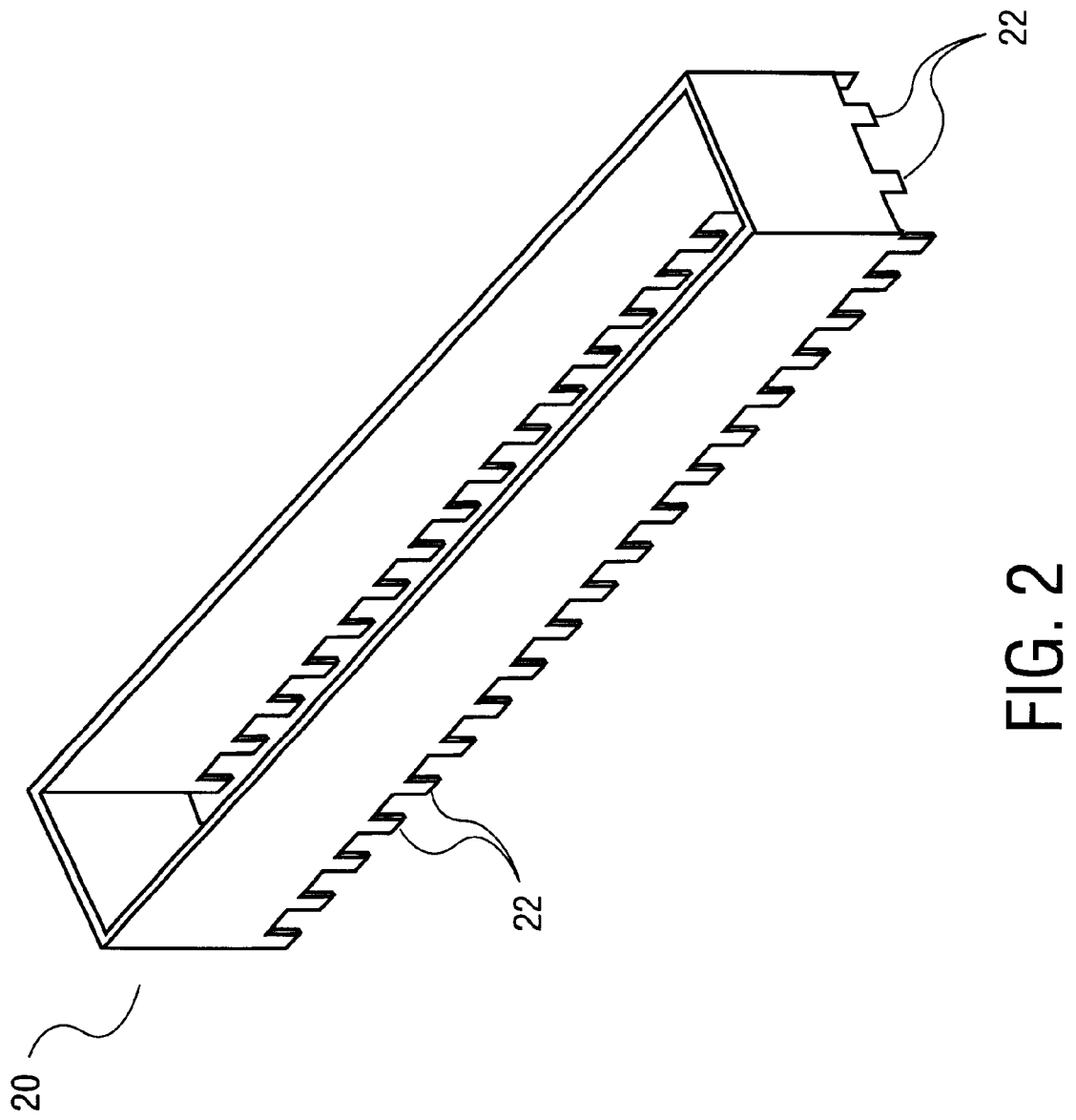
FIG. 2 shows an embodiment of an EMI inhibiting enclosure in accordance with the teachings of the present invention.

FIG. 2 shows one embodiment of the present invention. A conductive enclosure 20 is formed with a plurality of protrusions 22 extending from an edge of enclosure 20. Protrusions 22 can be integrally formed with conductive enclosure 20. Furthermore, the spacing between adjacent protrusions 22 is not fixed; the spacing is determined by the level of EMI containment needed. The shape of enclosure 20 is not limited to any one design. It is appreciated that the shape of enclosure 20 is appropriately determined by the contours of the EMI producing device to be enclosed.

Figure 3:
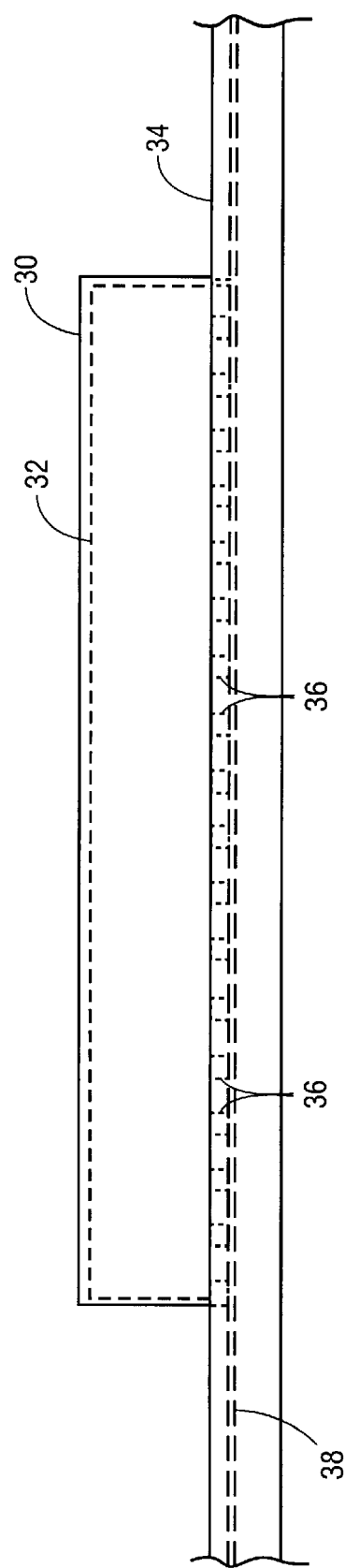
FIG. 3 shows another embodiment of an EMI inhibiting enclosure in accordance with the teachings of the present invention.

FIG. 3 shows an embodiment similar to the one shown in FIG. 2 where the embodiment of FIG. 3 is disposed on a substrate. Conductive enclosure 30 is placed around an EMI producing device 32, such as a microprocessor or a microprocessor in combination with a socket. Substrate 34, such as a printed circuit board, includes a grounding layer 38. Grounding extensions 36 are placed in slots (not shown) in substrate 34 which extend down to grounding layer 38. Grounding extensions 36 make contact with grounding layer 38 to ground conductive enclosure 30. Because grounding extensions 36 extend down into substrate 34 and ground enclosure 30, EMI is prevented from leaking out between enclosure 30 and substrate 34. In this embodiment, the height of enclosure 30 is greater than the height of EMI producing device 32.

Figure 4:
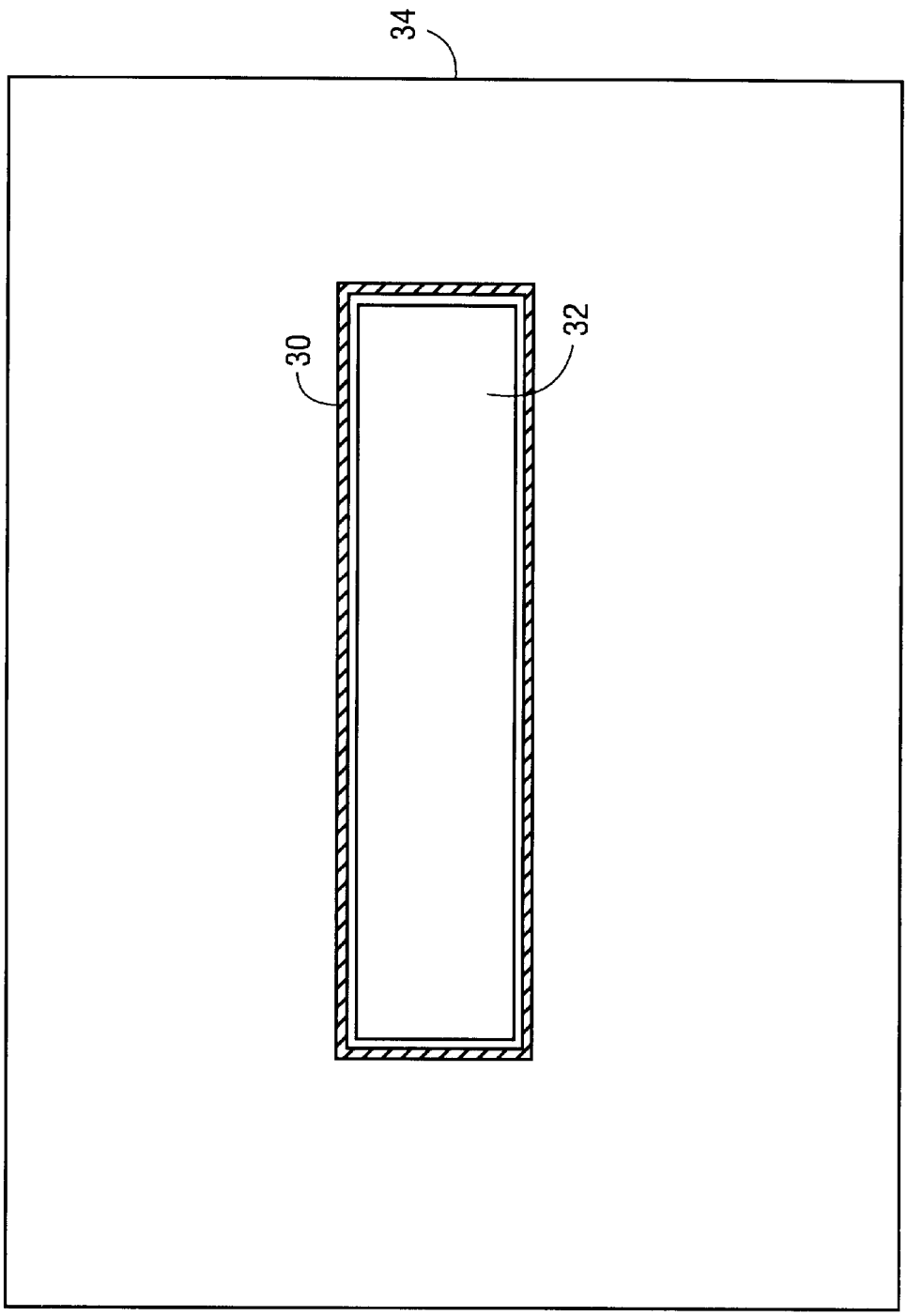
FIG. 4 shows a top view of the embodiment shown in FIG. 3.

FIG. 4 shows a top view of the embodiment shown in FIG. 3. Enclosure 30 surrounds the perimeter of EMI producing device 32. The top of device 32 is not covered by enclosure 30.

Figure 5:
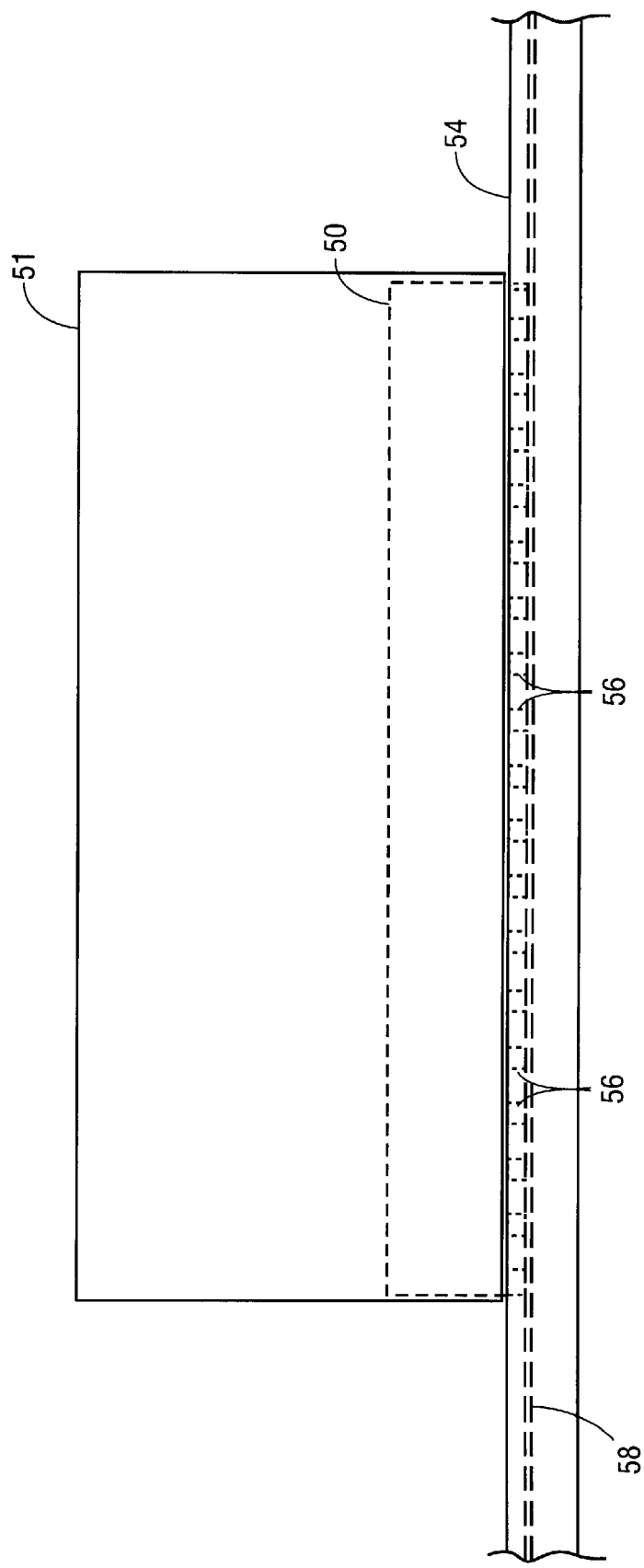
FIG. 5 shows yet another embodiment in accordance with the teachings of the present invention.

To prevent EMI from leaking from the top of a device, the present invention is mateable with an EMI containment box as shown in FIG. 5. EMI containment box 51, such as a Faraday cage, is placed over conductive enclosure 50. The outer surface of conductive enclosure 50 makes contact with the inner surface of EMI containment box 51 such that continuity can be maintained from EMI containment box 51 to conductive enclosure 50 to printed circuit board 54. Grounding extensions 56 of conductive enclosure 50 make contact with grounding layer 58 of printed circuit board 54 to ground both conductive enclosure 50 and EMI containment box 51. In one embodiment, once grounding extensions 56 are in contact with grounding layer 58, conductive enclosure 50 is affixed to printed circuit board 54 by soldering or spot welding grounding extensions 56 to printed circuit board 54. It is appreciated that other methods can be used to affix conductive enclosure 50 to printed circuit board 54. In another embodiment, EMI containment box 51 is part of a microprocessor cartridge which mates with the socket surrounded by enclosure 50. It is appreciated that EMI containment box 51 is not needed to fully enclose an EMI producing device. For example, conductive enclosure 50 could have an integrally formed top portion to prevent EMI leakage from the top of an EMI producing device.

Figure 6:
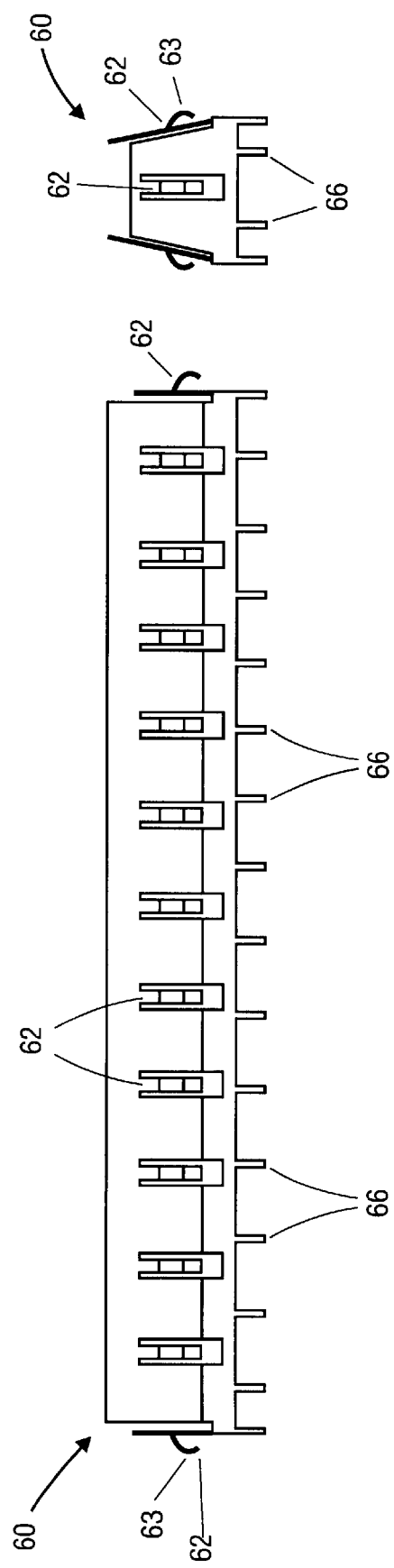
FIG. 6 shows still another embodiment in accordance with the teachings of the present invention.

FIG. 6 shows yet another embodiment of the present invention. Conductive enclosure 60 has a plurality of springable tabs 62 extending from an outer surface of enclosure 60. Each tab 62 has a bend 63 angled toward enclosure 60. Grounding pins 66 are integrally formed with enclosure 60 and extend from a bottom edge of enclosure 60. Tabs 62 facilitate contact between enclosure 60 and the inner surface of a Faraday cage/microprocessor cartridge that is disposed over enclosure 60. Tabs 62 have a spring action to allow numerous insertions and extractions of a Faraday cage/microprocessor cartridge and still provide sufficient contact between enclosure 60 and a Faraday cage/microprocessor cartridge. Bend 63 helps prevent tab 62 from snagging the inner surface of a Faraday cage/microprocessor cartridge upon extraction and damaging tab 62 and/or the Faraday cage/microprocessor cartridge. In one embodiment, enclosure 60, tabs 62 and grounding pins 66 are made from beryllium/copper with a tin coating to provide a desired combination of properties such as springiness, conductivity and corrosion resistance. It is appreciated that other materials can provide the desired properties. Furthermore, it is appreciated that enclosure 60 and the pattern of tabs 62 need not be symmetric. The configuration of enclosure 60 and tabs 62 should be chosen to provide sufficient contact between enclosure 60 and a mated Faraday cage/microprocessor cartridge.

Figure 7:
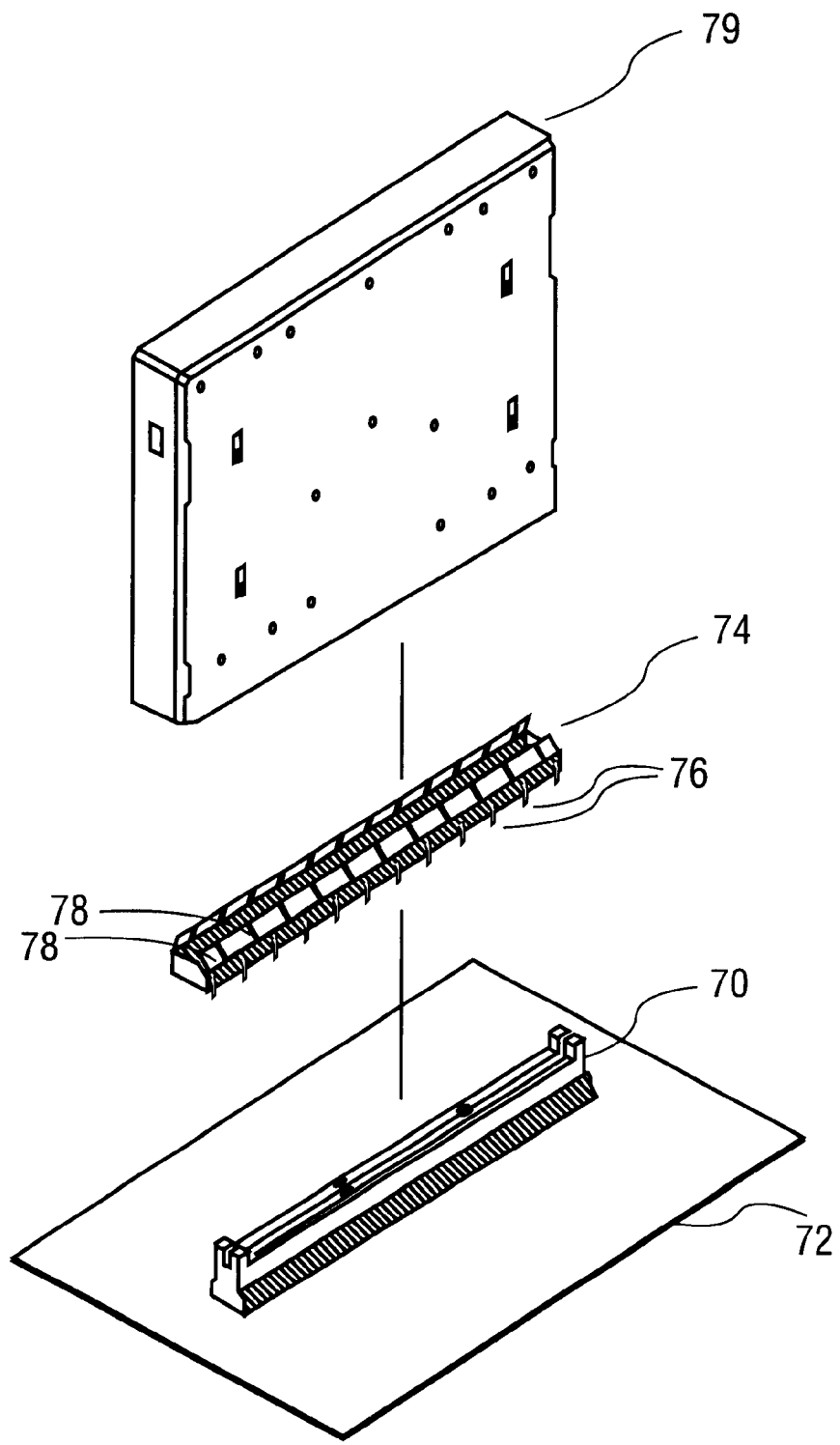
FIG. 7 shows an expanded view of an embodiment in accordance with the teachings of the present invention.

FIG. 7 shows an expanded view of another embodiment of the present invention. Microprocessor socket 70 is disposed on printed circuit board 72. EMI skirt 74 is to be placed over microprocessor socket 70 such that EMI skirt 74 surrounds at least the perimeter of microprocessor socket 70. Grounding pins 76 extending from a lower edge of EMI skirt 74 fit through mating holes (not shown) in printed circuit board 72 when EMI skirt 74 is placed over microprocessor socket 70. The mating holes allow grounding pins 76 to make contact with a grounding layer in printed circuit board 72. EMI skirt 74 can then be permanently affixed to printed circuit board 72 using commonly known methods. Once EMI skirt 74 is affixed to printed circuit board 72, Faraday cage 79, which can be part of a microprocessor cartridge, is placed over EMI skirt 74. Deflectable tabs 78, which are similar to tabs 62 shown in FIG. 6, make contact with an inner surface of Faraday cage 79 to provide continuity between EMI skirt 74 and Faraday cage 79. Deflectable tabs 78 are elastically deformable to ensure contact between Faraday cage 79 and EMI skirt 74 even after repeated placements and removals of Faraday cage 79. Furthermore, in one embodiment, tabs 78 are angled inward toward EMI skirt 74 to prevent tabs 78 from damaging an inner surface of Faraday cage 79 when Faraday cage 79 is removed from EMI skirt 74.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. An apparatus comprising:
   an enclosure for inhibiting electromagnetic interference (EMI);
   a plurality of protrusions extending from an edge of said enclosure; and
   a plurality of springable tabs extending away from a bottom edge of said enclosure and away from the interior of said enclosure, each springable tab including a bend extending as a separate piece from the springable tab and angled toward said enclosure, each bend capable of making contact with and bent inside an inner surface of a microprocessor cartridge.

2. The apparatus of claim 1 wherein said protrusions are insertable into a printed circuit board, said protrusions configured to make contact with a grounding layer in said printed circuit board to ground said enclosure.

3. The apparatus of claim 1 wherein said springable tabs are configured to allow disengaging of said microprocessor cartridge from said enclosure.

4. The apparatus of claim 1 wherein said enclosure is configured to surround an EMI producing device.

5. The apparatus of claim 2 wherein said protrusions are tabs.

6. An apparatus comprising:
   a conductive enclosure for containing EMI;
   a plurality of grounding extensions integrally formed with said conductive enclosure; and
   a plurality of repeatably deflectable tabs extending away from a bottom edge of said conductive enclosure and away from the interior of said conductive enclosure, each repeatably deflectable tab including a bend extending as a separate piece from the springable tab and angled toward said enclosure, each bend capable of making contact with and bent inside an inner surface of a microprocessor cartridge.

7. The apparatus of claim 6 wherein said grounding extensions are insertable into a printed circuit board, said grounding extensions configured to make contact with a grounding layer in said printed circuit board to ground said conductive enclosure.

8. The apparatus of claim 7 wherein said conductive enclosure is perimeterally disposed around a microprocessor socket.

9. The apparatus of claim 7 wherein said conductive enclosure is disposed over a microprocessor socket, said conductive enclosure covering said microprocessor socket.

10. The apparatus of claim 8 wherein said conductive enclosure has a first height and said microprocessor socket has a second height, said first height being at least equal to said second height.

11. A system comprising:
    a printed circuit board;
    a microprocessor socket disposed on said printed circuit board, said microprocessor socket having a perimeter;
    a conductive enclosure for containing EMI, said conductive enclosure surrounding said perimeter of said microprocessor socket;
    a plurality of grounding tabs integrally formed with said conductive enclosure, said grounding tabs making contact with a grounding layer in said printed circuit board to ground said conductive enclosure;
    a plurality of springable tabs extending away from a bottom edge of said conductive enclosure and away from the interior of said conductive enclosure, each of said springable tabs having a bend extending as a separate piece from the springable tab and angled toward said conductive enclosure;
    a microprocessor cartridge engaging said conductive enclosure, an inner conductive surface of said microprocessor cartridge making contact with said bends of said springable tabs, said microprocessor cartridge substantially covering said conductive enclosure.

12. The apparatus of claim 1 wherein the enclosure includes a top wall and sidewalls extending downward from a number of edges of the top wall, and a plurality of the springable tabs extending downward from a lower edge of one of the sidewalls.

* * * * *